(12) United States Patent
Lee

(10) Patent No.: US 11,152,896 B2
(45) Date of Patent: Oct. 19, 2021

(54) MULTISTAGE AMPLIFIER WITH CURRENT LIMITING CIRCUIT

(71) Applicant: ALI Corporation, Hsinchu (TW)

(72) Inventor: Andrew Yang Lee, Hsinchu (TW)

(73) Assignee: ALI Corporation, Hsinchu (TW)

( * ) Notice: Subject to any disclaimer, the term of this patent is extended or adjusted under 35 U.S.C. 154(b) by 140 days.

(21) Appl. No.: 16/673,983

(22) Filed: Nov. 5, 2019

(65) Prior Publication Data
US 2020/0266770 A1    Aug. 20, 2020

(30) Foreign Application Priority Data
Feb. 15, 2019    (CN) .......................... 201910116042.4

(51) Int. Cl.
*H03F 1/30*      (2006.01)
*H03F 3/45*      (2006.01)
*G05F 1/575*    (2006.01)

(52) U.S. Cl.
CPC ............. *H03F 1/301* (2013.01); *G05F 1/575* (2013.01); *H03F 3/45273* (2013.01)

(58) Field of Classification Search
CPC . H03F 1/30; H03F 1/301; H03F 1/303; H03F 1/307; H03F 1/308; H03F 1/3205; H03F 1/3247; H03F 3/45179; H03F 3/45273; H03F 3/45636
See application file for complete search history.

(56) References Cited

U.S. PATENT DOCUMENTS 9,348,348 B2 *   5/2016   Kronmueller ............. G05F 1/56
2014/0375289 A1 * 12/2014   Kronmueller ........... G05F 1/565
                                                                                                           323/280

* cited by examiner

*Primary Examiner* — Long Nguyen
(74) *Attorney, Agent, or Firm* — Winston Hsu

(57) ABSTRACT

A multistage amplifier for outputting a first output signal includes: an input stage circuit, a middle stage circuit and an output stage circuit. The input stage circuit includes at least one amplifying circuit, which receives the first output signal and a reference signal, thereby to generate a second output signal at an output terminal of the input stage circuit. The middle stage circuit is used to perform frequency compensation on the multistage amplifier. The output stage circuit is used to generate the first output signal at an output terminal of the output stage circuit according to the second output signal. The output stage circuit includes at least one current limiting circuit, where the current limiting circuit is controlled by the second output signal, thereby to adjusting a voltage level of the first output signal.

6 Claims, 3 Drawing Sheets

MULTISTAGE AMPLIFIER WITH CURRENT LIMITING CIRCUIT

BACKGROUND OF THE INVENTION

1. Field of the Invention

The present invention relates to multistage amplifier, and more particularly, to a multistage amplifier with a current limiting circuit.

2. Description of the Prior Art

Multistage amplifiers are widely used in a variety of analog circuits, such as, low-dropout regulator (LDO) or buffers. Typically, an output stage of the multistage amplifier consists of a power element. The power element is controlled by a previous stage to provide a stable voltage and/or current from a power supply terminal to an output terminal of the multistage amplifier, thereby to form an output signal. Since the power element generates leakage current, even in the case where the multistage amplifier is turned off, the leakage current still flows into parasitic capacitance or load capacitance at the output terminal, which causes a voltage at the output terminal to gradually rise. Eventually, this may lead to the voltage at the output terminal to approach the supply voltage VDD at the power supply terminal. As a consequence, a following stage may be damaged. For example, when a multistage amplifier is designed to function as a low-dropout regulator, this means that an available voltage range of a following stage is much lower than a supply voltage VDD. Under such condition, the following state may burn out by excessively high voltage at the output terminal that is caused by the leakage current.

To overcome such problem, there is a conventional solution that deploys a constant load at the output terminal. However, the constant load introduces extra power consumption, though it prevents the increasing of voltage level at the output terminal. In view of this, there is a need for providing a solution can address the "increasing output voltage level" problem that is caused by leakage current, without significantly increasing power consumption.

SUMMARY OF THE INVENTION

To address the above-mentioned problems, it is one object of the present invention to provide a solution that introduces a self-adjustable loading to an output terminal of the multistage amplifier. According to the solution provided by the present invention, a current limiting circuit that is comprised of transistors is coupled to the output terminal of the multistage amplifier. The current limiting circuit is controlled by an input stage circuit of the multistage amplifier. The input stage circuit produces a signal for controlling the current limiting circuit according to a voltage signal feedback by an output terminal of the output stage circuit such that increasing of the voltage at the output terminal of the output stage circuit can be suppressed. Because the current limiting circuit of the present invention is controlled by the input stage circuit, there is no need for an additional biasing circuit or control circuit to adjust operations of the current limiting circuit. Moreover, the current limiting circuit may be turned off if the voltage at the output terminal does not rise up severely, which is favorable for low power design.

According to one embodiment of the present invention, a multistage amplifier that is employed for outputting a first output signal is provided. The multistage amplifier comprises: an input stage circuit, a middle stage circuit and an output stage circuit. The input stage circuit includes at least one amplifying circuit, where the amplifying circuit receives the first output signal and a reference signal, thereby to accordingly generate a second output signal at an output terminal of the input stage circuit. The middle stage circuit is coupled to the input stage circuit, and used to perform frequency compensation on the multistage amplifier. The output stage circuit is coupled to the middle stage circuit and the input stage circuit, and used to generate the first output signal at an output terminal of the output stage circuit according to the second output signal. The output stage circuit includes at least one current limiting circuit, where the current limiting circuit is controlled by the second output signal, thereby to adjusting a voltage level of the first output signal.

These and other objectives of the present invention will no doubt become obvious to those of ordinary skill in the art after reading the following detailed description of the preferred embodiment that is illustrated in the various figures and drawings.

DETAILED DESCRIPTION

In the following description, numerous specific details are set forth in order to provide a thorough understanding of the present embodiments. It will be apparent, however, to one having ordinary skill in the art that the specific detail need not be employed to practice the present embodiments. In other instances, well-known materials or methods have not been described in detail in order to avoid obscuring the present embodiments.

Reference throughout this specification to "one embodiment", "an embodiment", "one example" or "an example" means that a particular feature, structure or characteristic described in connection with the embodiment or example is included in at least one embodiment of the present embodiments. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or sub-combinations in one or more embodiments or examples.

Figure 1:
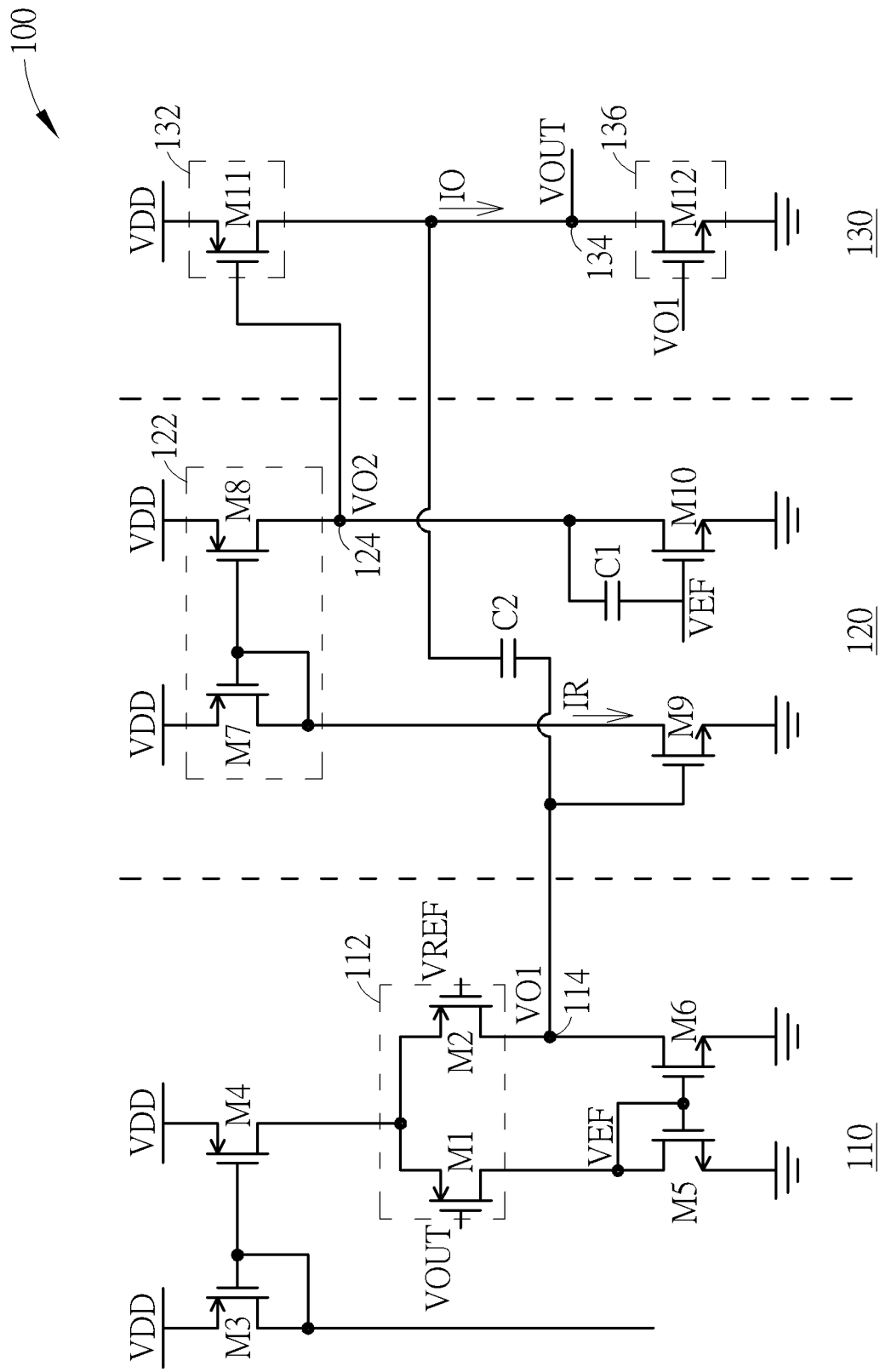
FIG. 1 illustrates a multistage amplifier according to one embodiment of the present invention.
Figure 2:
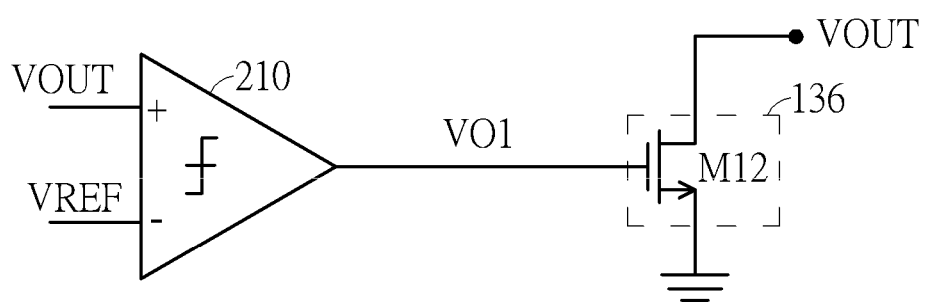
FIG. 2 illustrates how the multistage amplifier is controlled by an input stage circuit.

FIG. 1 illustrates a circuit diagram of a multistage amplifier 100 according to one embodiment of the present invention. The multistage amplifier 100 comprises an input stage circuit 110, a middle stage circuit 120 and an output stage circuit 130. Please note that the multistage amplifier 100 could comprise more stages in various embodiments of the present invention. For example, there could be one or more stages prior to the input stage circuit 110. In addition, there could be also one or more stages between the input stage circuit 110 and the middle stage circuit 120 or between the middle stage circuit 120 and the output stage circuit 130. Therefore, the illustrated three stage circuits 110, 120 and 130 are not the only one implementation of the multistage amplifier of the present invention. Moreover, the multistage amplifier 100 could be alone or in combination with other circuits as a low dropout regulator.

The input stage circuit 110 comprises a differential pair 112 including transistors M1 and M2, which are employed as an amplifying circuits for providing high gain. One of inputs of the differential pair 112 is a reference signal VREF, while the other of the inputs of the differential pair 112 is an output signal VOUT which comes from the output stage circuit 130 of the multistage amplifier 100. Based on the reference signal VREF and the output signal VOUT, the differential pair 112 generates an output signal VO1 on an output terminal 114 of the input stage circuit 110. In addition, the input stage circuit 110 further includes transistors M3-M6, which are used to bias the transistors M1 and M2 of the differential pair 112 and provide output impedances.

The middle stage circuit 120 is coupled to the input stage circuit 110 and used to perform frequency compensation on the multistage amplifier 100. The middle stage circuit 120 comprises a current mirror 122 that is formed by transistors M7 and M8. When the output signal VO1 of the input stage circuit 110 is inputted to the middle stage circuit 120, a reference current IR will be generated on the transistor M9. Accordingly, the current mirror 122 mirrors the reference current IR to generate an output signal VO2 at an output terminal 124 of the middle stage circuit 120. A transistor M10 and a capacitor C1 of the middle state circuit 120 can apply frequency compensation on the multistage amplifier 100.

The output stage circuit 130 is coupled to the middle stage circuit 120 and the input stage circuit 110. The output stage circuit 130 is used to generate an output signal VOUT at an output terminal 134 of the output stage circuit 130 in accordance with the output signal VO2 provided by the middle stage circuit 120. The output stage circuit 130 comprises a power element 132. The power element 132 is coupled to the output terminal 134 of the output stage circuit 130. The power element 132 is controlled by the output signal VO2 of the middle stage circuit 120, thereby to provide a current IO to the output terminal 134 from the supply voltage VDD, forming the output signal VOUT.

In a preferred embodiment, the power element 132 could be implemented with a power transistor M11. A gate of the power transistor M11 is coupled to the output terminal 124 of the middle stage circuit 120, a source of the power transistor M11 is coupled to the supply voltage VDD and a drain of the power transistor M11 is coupled to the output terminal 134 of the output stage circuit 130. The conductivity of the power transistor M11 is controlled by the signal VO2 on its gate, thereby to adjust the current IO flowing to the output terminal 134, such that the output signal VOUT can be changed. According to various embodiments of the present invention, the power element 132 could comprise other elements for assisting its operations. In addition, the output terminal 114 of the input stage circuit 110 is coupled to the output terminal 134 of the output stage circuit 130 through a capacitive element C2.

To address the problem that the leakage current of the power element 132 raises the voltage level of the output terminal 134, a current limiting circuit 136 is deployed in the output stage circuit 130. The current limiting circuit 136 is controlled by the output signal VO1 of the input stage circuit 110, thereby to adjust the voltage level of the output signal VOUT. In a preferred embodiment, the current limiting circuit 136 is implemented with a current limiting transistor M12. A gate of the current limiting transistor M12 is coupled to the output terminal 114 of the input stage circuit 110, a drain of the current limiting transistor M12 is coupled to the output terminal 134 of the output stage circuit 130, and a source of the current limiting transistor M12 is coupled to ground. The conductivity of the current limiting transistor M12 is controlled by the signal VO1 at its gate, thereby to guide the leakage current of the power element 132 to ground (and discharge to the output terminal 134). As a consequence, increasing of the voltage level, which is caused by the fact that leakage current flows into the parasitic capacitances or the load capacitances, can be suppressed. According to various embodiments of the present invention, the current limiting circuit 136 may further comprise other components that can assist its operations.

Please refer to FIG. 2 and FIGS. 3A-3C for better understandings on effects provided by the current limiting circuit 136. According to FIG. 2, the differential pair 112 of the input stage circuit 110 is identical in function to a comparator 210 of FIG. 2, which substantially adjusts the output signal VO1 according to a difference between the output signal VOUT and the reference signal VREF, where the output signal VO1 is further used to adjust the conductivity of the current limiting transistor M12, thereby to suppress the increasing of the voltage level of the output signal VOUT. For example, when the output signal VOUT is greater than the reference signal VREF to a certain extent, such as, by 1 mV, the current limiting circuit 136 could lower the voltage level of the output signal VOUT according to the output signal VO1.

Figure 3A:
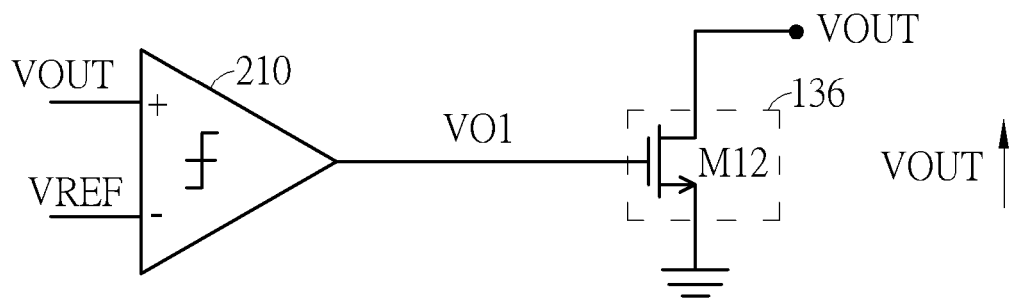
FIGS. 3A-3C illustrates how a voltage at an output terminal of an output stage circuit affects operations of a current limiting circuit.
Figure 3B:
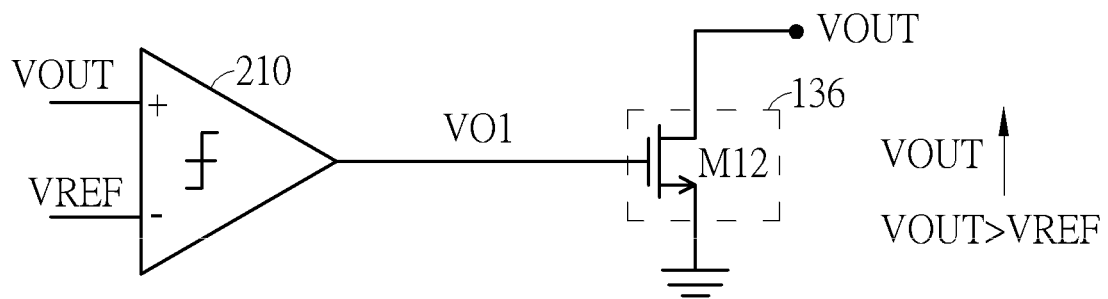
Figure 3C:
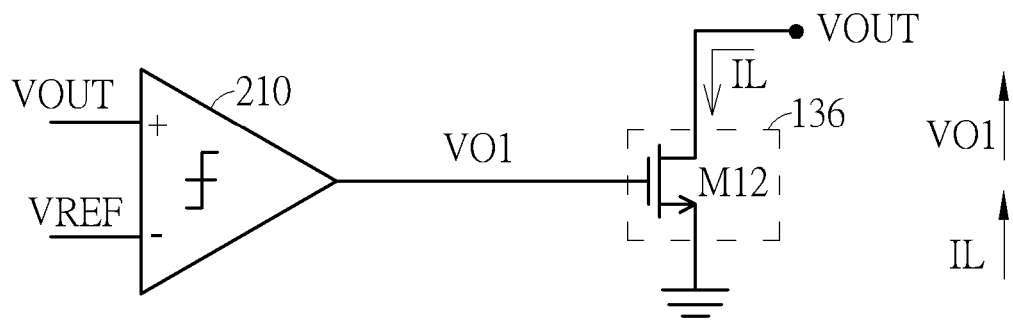

FIGS. 3A-3C illustrates further details. As shown by FIG. 3A, the voltage level of the output signal VOUT increases along with the leakage current. In FIG. 3B, the output signal VOUT is feedback to an input terminal of the comparator 210. As the voltage level of the output signal VOUT increases, the difference between the levels of the output signal VOUT and the reference signal VREF become larger (where the voltage level of the output signal VOUT is larger than the voltage level of the reference signal VREF in this example), such that the comparator 210 outputs the larger output signal VO1. Accordingly, in FIG. 3C, as the output signal VO1 rises up, the current limiting transistor M12 will be turned on (or the conductivity of the current limiting transistor M12 will increase), thereby to produce the current-limiting current IL (or increase the existing current-limiting current IL). As a result, the voltage level of the output signal VOUT can be reduced.

In conclusion, the current limiting circuit 136 of the present invention can effectively suppress increasing of the output signal VOUT at the output terminal 134 of the multistage amplifier 100 that is caused by the leakage current. Additionally, the current limiting circuit 136 is controlled by the differential pair 112 in the input stage circuit 110, and the control over the current limiting circuit 136 as well as the conductivity of the current limiting transistor M12 inside the current limiting circuit 136 can be also adaptively adjusted by the differential pair 112 according to the feedback of the output signal VOUT. As such, in the case that the output signal VOUT is not excessively large compared to the reference signal VREF, the current limiting circuit 136 is limitedly conducted or even fully turned off. Therefore, the overall power consumption of the multistage amplifier 100 will not significantly increase. As for constant loads used in the conventional art, they are usually resistors or transistors that are controlled by additional biasing circuits, which occupy greater area on the IC and costs more power. In contrast to this, the current limiting circuit 136 of the present invention has lower power consumption, which is favorable for low power design.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A multistage amplifier adapted to output a first output signal, comprising:
an input stage circuit, comprising at least one amplifying circuit, wherein the amplifying circuit receives the first output signal and a reference signal, and accordingly generates a second output signal at an output terminal of the input stage circuit;
a middle stage circuit, coupled to the input stage circuit, used to perform frequency compensation on the multistage amplifier; and
an output stage circuit, coupled to the middle stage circuit and the input stage circuit, used to generate the first output signal at an output terminal of the output stage circuit according to the second output signal, wherein the output stage circuit comprises:
at least one current limiting circuit, controlled by the second output signal to adjust a voltage level of the first output signal; and
a power transistor, a control terminal of the power transistor being coupled to an output terminal of the middle stage circuit, a first terminal of the power transistor being coupled to a power supply, and a second terminal of the power transistor being coupled to the output terminal of the output stage circuit, wherein the power transistor is arranged to provide a current from the power supply to the output terminal of the output stage circuit the middle stage circuit further comprises a current mirror, which is arranged to mirror a reference current that is generated based on the second output signal, thereby to control the power transistor through the output terminal of the middle stage circuit.

2. The multistage amplifier of claim 1, wherein when the first output signal is greater than the reference signal to a certain extent, the current limiting circuit lowers the voltage level of the first output signal according to the second output signal.

3. The multistage amplifier of claim 1, wherein the current limiting circuit comprises a current limiting switch, a control terminal of the current limiting switch is coupled to the output terminal of the input stage circuit, a first terminal of the current limiting switch is coupled to the output terminal of the output stage circuit and a second terminal of the current limiting switch is coupled to ground;
and the current limiting switch is controlled by the second output signal to generate an output current flowing to ground, thereby to adjust the voltage level of the first output signal.

4. The multistage amplifier of claim 1, wherein the output terminal of the input stage circuit is coupled to the output terminal of the output stage circuit through a capacitive element.

5. The multistage amplifier of claim 1, wherein the amplifying circuit of the input stage circuit comprises a differential pair; a first input terminal of the differential pair is coupled to the first output signal, and a second input terminal of the differential pair is coupled to the reference signal.

6. The multistage amplifier of claim 1, wherein the multistage amplifier is a low dropout regulator.

* * * * *